US008861276B2

(12) United States Patent
Shim et al.

(10) Patent No.: US 8,861,276 B2
(45) Date of Patent: *Oct. 14, 2014

(54) NONVOLATILE MEMORY DEVICE, MEMORY SYSTEM COMPRISING SAME, AND METHOD OF OPERATING SAME

(75) Inventors: Dongkyo Shim, Seoul (KR); Jaeyong Jeong, Yongin-si (KR); Ju Seok Lee, Seoul (KR); Ohsuk Kwon, Seoul (KR); Kitae Park, Seongnam-si (KR); Hyunjun Yoon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

This patent is subject to a terminal disclaimer.

(21) Appl. No.: 13/527,641

(22) Filed: Jun. 20, 2012

(65) Prior Publication Data

US 2012/0327711 A1  Dec. 27, 2012

Related U.S. Application Data

(63) Continuation-in-part of application No. 13/526,794, filed on Jun. 19, 2012.

(30) Foreign Application Priority Data

Jun. 21, 2011  (KR) .......................... 10-2011-0060289
Jan. 3, 2012   (KR) .......................... 10-2012-0000592

(51) Int. Cl.
*G11C 16/26*   (2006.01)
*G11C 16/04*   (2006.01)
*G11C 11/56*   (2006.01)

(52) U.S. Cl.
CPC ............ *G11C 16/26* (2013.01); *G11C 16/0483* (2013.01); *G11C 11/5642* (2013.01)
USPC .................................................... 365/185.18

(58) Field of Classification Search
CPC .................................................... G11C 16/0483
USPC .................................................... 365/185.108
See application file for complete search history.

(56) References Cited

U.S. PATENT DOCUMENTS

| 7,257,027 | B2 | 8/2007 | Park | |
| 7,274,617 | B2 | 9/2007 | Sakurai et al. | |
| 7,835,174 | B2 | 11/2010 | Tokiwa | |
| 2006/0104113 | A1* | 5/2006 | Hsieh et al. | 365/185.2 |
| 2008/0298127 | A1* | 12/2008 | Kim et al. | 365/185.17 |
| 2009/0059660 | A1* | 3/2009 | Lee et al. | 365/185.02 |
| 2010/0177568 | A1* | 7/2010 | Chen et al. | 365/185.18 |
| 2010/0290282 | A1 | 11/2010 | Huang et al. | |

(Continued)

FOREIGN PATENT DOCUMENTS

| JP | 2006147111 A | 6/2006 |
| JP | 2007012240 A | 1/2007 |

(Continued)

*Primary Examiner* — Hoai V Ho
*Assistant Examiner* — Min Huang
(74) *Attorney, Agent, or Firm* — Volentine & Whitt, PLLC

(57) ABSTRACT

A method of operating a nonvolatile memory device comprises receiving a read command from a memory controller, determining a read mode of the nonvolatile memory device, selecting a read voltage based on the read mode, and performing a read operation on memory cells of a selected page of the nonvolatile memory device using the selected read voltage.

18 Claims, 13 Drawing Sheets

(56) References Cited

U.S. PATENT DOCUMENTS

| | | |
|---|---|---|
| 2011/0122684 A1 | 5/2011 | Sheu et al. |
| 2012/0331210 A1* | 12/2012 | Jeong et al. .................. 711/103 |
| 2013/0194883 A1* | 8/2013 | Lee .............................. 365/201 |

FOREIGN PATENT DOCUMENTS

| | | |
|---|---|---|
| KR | 1020070002344 A | 1/2007 |
| KR | 100758397 B1 | 9/2007 |
| KR | 1020110001080 A | 1/2011 |

* cited by examiner

US 8,861,276 B2

NONVOLATILE MEMORY DEVICE, MEMORY SYSTEM COMPRISING SAME, AND METHOD OF OPERATING SAME

CROSS-REFERENCE TO RELATED APPLICATIONS

This application claims priority under 35 U.S.C §119 to Korean Patent Applications Nos. 10-2011-0060289 filed Jun. 21, 2011 and 10-2012-0000592 filed Jan. 13, 2012, the subject matter of which is hereby incorporated by reference.

BACKGROUND OF THE INVENTION

The inventive concept relates generally to semiconductor memory devices. More particularly, the inventive concept relates to a nonvolatile memory device and a memory system comprising the same.

Semiconductor memory devices can be roughly divided into two categories according to whether they retain stored data when disconnected from power. These categories include volatile semiconductor memory devices, which lose stored data when disconnected from power, and nonvolatile semiconductor memory devices, which retain stored data when disconnected from power. Examples of volatile semiconductor memory devices include dynamic random access memory (DRAM) and static random access memory (SRAM), and examples of nonvolatile semiconductor memory devices include mask read-only memory (MROM), programmable ROM (PROM), erasable programmable ROM (EPROM), and electrically erasable programmable ROM (EEPROM).

Flash memory is a representative example of an EEPROM. Flash memory device is commonly used to store many forms of data (e.g., voice and image data) in information appliances such as computers, cellular phones, personal digital assistants (PDAs), digital cameras, camcorders, voice recorders, MP3 players, handheld PCs, game machines, facsimile machines, scanners, printers, and so on.

In an attempt to provide increased storage capacity, researchers have developed flash memory devices capable of storing multiple bits of data per memory cell. Such devices are commonly referred to as multi-level cell (MLC) or multi-bit memory devices. Because of the way they are designed, MLC memory devices may experience tighter operating margins compared with memory devices storing only one bit of data per memory cell. Consequently, they may be more susceptible to errors, defects, and/or diminished performance.

SUMMARY OF THE INVENTION

According to one embodiment of the inventive concept, a nonvolatile memory device comprises a cell array connected to a plurality of bit lines and a plurality of word lines, a page buffer circuit configured to sense memory cells connected to a selected word line via the plurality of bit lines, a voltage generator configured to provide a read voltage to the selected word line, and control logic configured to control the page buffer circuit and the voltage generator to sense the memory cells connected to the selected word line according to a first read mode or a second read mode. The number of memory cells to be sensed in the first read mode is different from the number of memory cells to be sensed in the second read mode, and a read voltage on the same data state varies according to the number of memory cells to be sensed.

According to another embodiment of the inventive concept, a memory system comprises a nonvolatile memory device having an all bit line structure, and a memory controller configured to transmit to the nonvolatile memory device a command for a read operation of a selected page, wherein the command is a full page read command or a partial page read command. The nonvolatile memory device is configured to perform the read operation for a predetermined data value with a read voltage that varies according to whether the command is a full page read command or a partial page read command.

According to still another embodiment of the inventive concept, a method of operating a nonvolatile memory device comprises receiving a read command from a memory controller, determining a read mode of the nonvolatile memory device, selecting a read voltage based on the read mode, and performing a read operation on memory cells of a selected page of the nonvolatile memory device using the selected read voltage.

These and other embodiments of the inventive concept can potentially improve the performance of a nonvolatile memory device or memory system by adapting operations according to potential noise factors, among other things.

BRIEF DESCRIPTION OF THE DRAWINGS

The drawings illustrate selected embodiments of the inventive concept. In the drawings, like reference numbers indicate like features.

DETAILED DESCRIPTION

Figure 1:
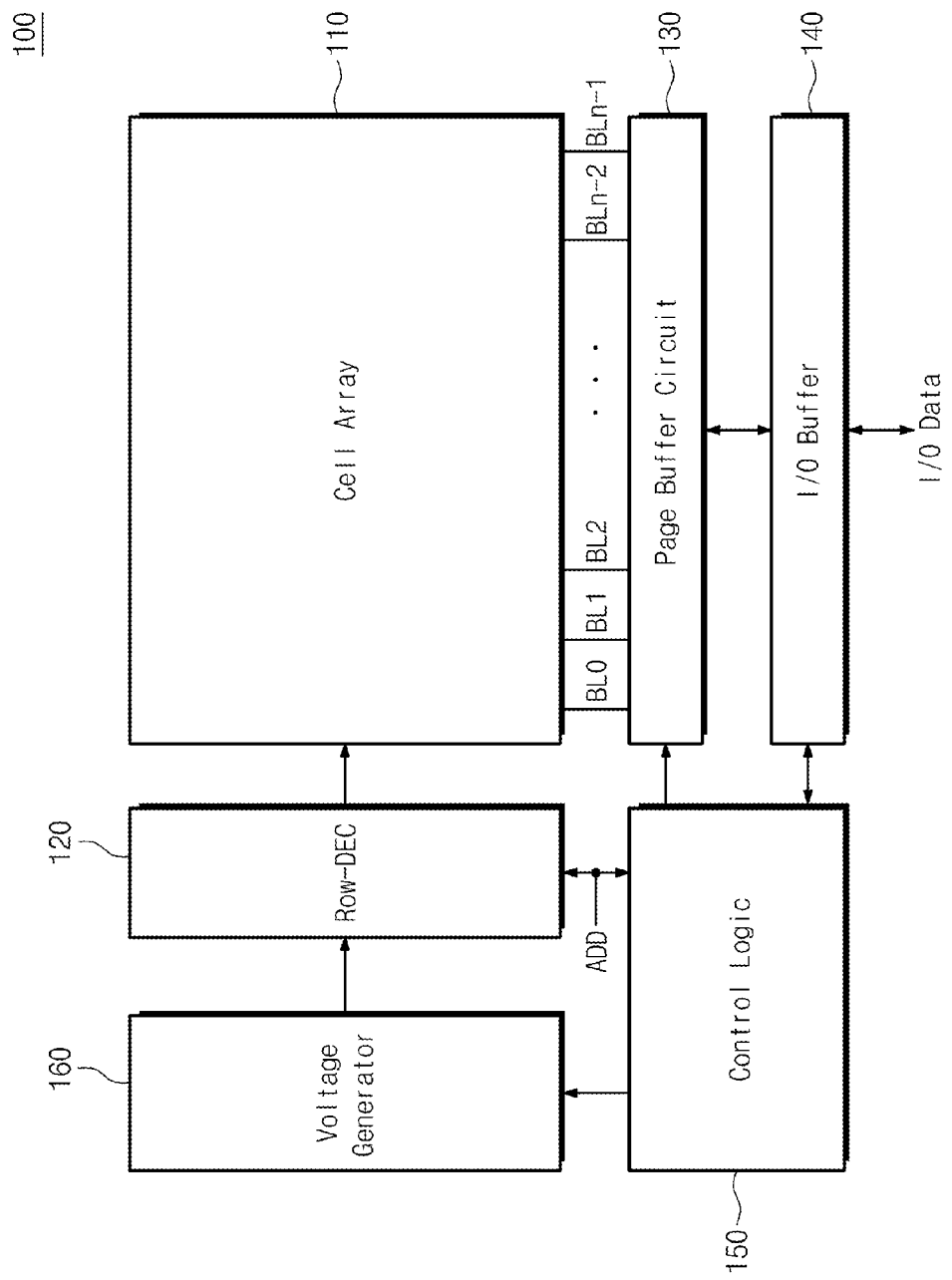
FIG. 1 is a block diagram illustrating a nonvolatile memory device according to an embodiment of the inventive concept.

The inventive concept is described more fully hereinafter with reference to the accompanying drawings, in which embodiments of the inventive concept are shown. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device 100 according to an embodiment of the inventive concept.

Referring to FIG. 1, nonvolatile memory device 100 comprises a cell array 110, a row decoder 120, a page buffer circuit 130, an input/output buffer 140, control logic 150, and a voltage generator 160.

Cell array 110 is coupled with row decoder 120 via word lines or selection lines. Cell array 110 is coupled with page buffer circuit 130 via bit lines BL0 to BLn−1. Cell array 110 comprises a plurality of NAND cell strings, each of which comprises a channel formed in a vertical or horizontal direction. The word lines of cell array 110 may be stacked in a vertical direction, and cell array 110 may have an all bit line (ABL) structure. With the ABL structure, a page buffer is connected to a bit line, and memory cells connected to a selected word line can be programmed at the same time.

Row decoder 120 selects any one of memory blocks of cell array 110. Row decoder 120 selects one of word lines in the selected memory block. Row decoder 120 transfers voltages provided from voltage generator 160 to word lines of the selected memory block. In a program operation, row decoder 120 transfers a program voltage Vpgm to a selected word line and a pass voltage Vpass to an unselected word line, respectively. In a read operation, row decoder 120 transfers a selection read voltage Vrd to the selected word line and an non-selection read voltage (or, a read pass voltage) Vread to the unselected word line, respectively.

Page buffer circuit 130 operates as a write driver or a sense amplifier according to a mode of operation. In a program operation, page buffer circuit 130 provides a bit line of cell array 110 with a bit line voltage corresponding to program data. In a read operation, page buffer circuit 130 senses data stored in a selected memory cell via a bit line. Page buffer circuit 130 then latches the sensed data to output it to input/output buffer 140. Page buffer circuit 130 comprises a plurality of page buffers connected to bit lines, respectively.

In some embodiments, page buffer circuit 130 is coupled with cell array 110 having the all bit line structure. It can read all data of a selected page in a time in a read mode referred to as a full page read mode. It can also selectively read a part of a selected page in a read mode referred to as a partial page read mode. In the partial page read mode, page buffer circuit 130 grounds bit lines of unselected memory cells to enable bit lines of selected memory cells to be shielded by the grounded bit lines. The partial page read mode comprises a half page read mode and a quarter page read mode. In the half page read mode, half of memory cells in a selected page are read. In the quarter page read mode, memory cells in a selected page are read by the quarter page. In some embodiments, the half page read mode is used as the partial page read mode.

In a program operation, input/output buffer 140 transfers input write data (or, program data) to page buffer circuit 130. In a read operation, input/output buffer 140 outputs read data provided from page buffer circuit 130 to an external device. Input/output buffer 140 transfers input address or command to control logic 150 or row decoder 120.

Control logic 150 controls page buffer circuit 130 and voltage generator 160 in response to a command CMD and an address ADD transferred from input/output buffer 140. Control logic 150 controls page buffer circuit 130 and voltage generator 160 such that selected memory cells are sensed in different manners according to a read mode. This may be to compensate for a sensing noise in a read operation. For example, in the full page read mode, control logic 150 may control page buffer circuit 130 and voltage generator 160 to sense selected memory cells in a coarse-fine sensing manner. In the partial page read mode, control logic 150 may control page buffer circuit 130 and voltage generator 160 to sense selected memory cells in a sensing manner different from the coarse-fine sensing manner.

Coarse-fine sensing may be used to reduce sensing noise. In the coarse-fine sensing, selected memory cells are sensed twice using different read voltages. That is, the coarse-fine sensing comprises a coarse sensing operation and a fine sensing operation. In the coarse sensing operation, selected memory cells are sensed using a level lower than a target level. In the fine sensing operation, "off" cells among cells sensed by the coarse sensing operation are selected, and then the selected off cells are sensed using the target level. Data sensed and latched via the fine sensing operation is output as final read data. In the all bit line structure, some "on" cells may be sensed by the coarse sensing. Because on cells selected in the coarse sensing are excluded in the fine sensing, common source line (CSL) noise may be reduced.

In the partial page read mode, control logic 150 controls page buffer circuit 130 and voltage generator 160 to sense selected memory cells. At this time, a read voltage is provided once with respect to one data state. In the partial page read mode, control logic 150 controls page buffer circuit 130 to ground unselected bit lines.

Voltage generator 160 generates word line voltages to be supplied to word lines and a voltage to be supplied to a bulk (e.g., a well region) where memory cells are formed, under the control of control logic 150. The word line voltages to be supplied to word lines comprise a program voltage Vpgm, a pass voltage (or, a program pass voltage) Vpass, selection and non-selection read voltages Vrd and Vread, and the like. Voltage generator 160 generates selection line voltages $V_{SSL}$ and $V_{GSL}$ to be supplied to selection lines SSL and GSL at program and read operations.

In the partial page read mode, voltage generator 160 provides a read voltage that has a level different from that provided in the full page read mode. For example, a read voltage provided in the partial page read mode may be equal to that provided in a fine sensing operation. However, in the partial page read mode, voltage generator 160 may provide a read voltage that has a level higher than that provided in the fine sensing operation.

The number of memory cells selected in the partial page read mode is less than that selected in the full page read mode. For this reason, CSL noise in the partial page read mode may be less than that in the full page read mode. Thus, it is possible to provide a read voltage that is provided in the partial page read mode and has the same level as that at fine sensing associated with the same data state. With the above-described features, it is possible to secure high reliability of data even in the partial page read mode.

As indicated by the foregoing, nonvolatile memory device 100 can be configured to provide different read voltage levels to selected memory cells according to a read mode, which can potentially compensate CSL noise and improve read speed.

Figure 2:
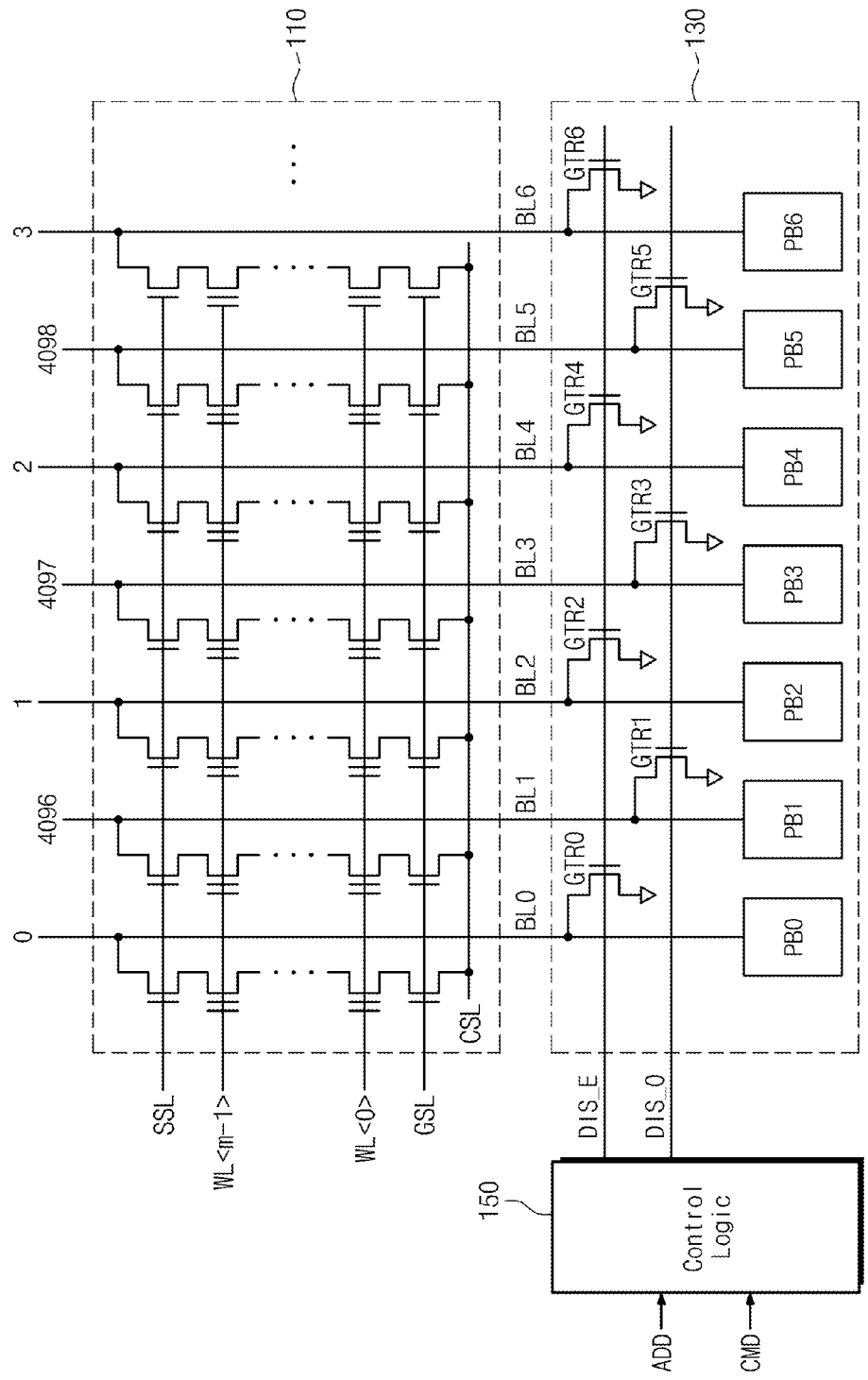
FIG. 2 is a block diagram illustrating a cell array and a page buffer circuit in FIG. 1 according to an embodiment of the inventive concept.

FIG. 2 is a block diagram illustrating a cell array and a page buffer circuit in FIG. 1 according to an embodiment of the inventive concept.

Referring to FIG. 2, continuous column addresses may be assigned to even-numbered bit lines, and continuous column addresses may be assigned to odd-numbered bit lines. Cell array 110 comprises a plurality of bit lines BL0 to BLn−1. Column addresses of an even-numbered bit line and an odd-numbered bit line in cell array 110 are not continuous. That is, even-numbered bit lines and odd-numbered bit lines may be addressed to have non-continuous column addresses. For example, in the event that one page has a size of 8 KB, even-numbered bit lines BLi (i=0, 2, 4, etc.) may be accessed by column addresses 0, 1, 2, etc., respectively, and odd-numbered bit lines BLj (j=1, 3, 5, etc.) may be accessed by column addresses 4096, 4097, 4098, etc., respectively.

Page buffer circuit 130 comprises page buffers PB0 to PBn−1 connected with bit lines BL0 to BLn−1, respectively. Page buffers PB0 to PBn−1 write or read data in or from selected memory cells via corresponding bit lines BL0 to BLn−1. In particular, page buffer circuit 130 comprises ground transistors GTR0 to GTRn−1 configured to ground unselected bit lines under the control of control logic 150. If a column address corresponding to a partial page read mode is provided, control logic 150 may activate one of control signals DIS_E and DIS_O to ground unselected bit lines.

FIG. 2 shows an example where ground transistors GTR0 to GTRn−1 are provided within page buffer circuit 130. However, the inventive concept is not limited to this example, and ground transistor GTR0 to GTRn−1 can be formed outside page buffer circuit 130.

Control logic 150 outputs control signals DIS_E and DIS_O for grounding unselected bit lines according to a read mode (e.g., a full page read mode or a partial page read mode). In the full page read mode, control logic 150 inactivates control signals DIS_E and DIS_O. In the partial page read mode (e.g., a half page read mode), control logic 150 may activate one of control signals DIS_E and DIS_O to ground unselected bit lines. Control logic 150 determines activation of the control signals DIS_E and DIS_O based upon a command CMD or an address ADD.

With the above-described features, unselected bit lines may be grounded in the partial page read mode, and selected bit lines may be shielded by the unselected bit lines being grounded. With the above-described column addressing manner, data sensed in the partial page read mode may be output to an external device without modification.

Figure 3:
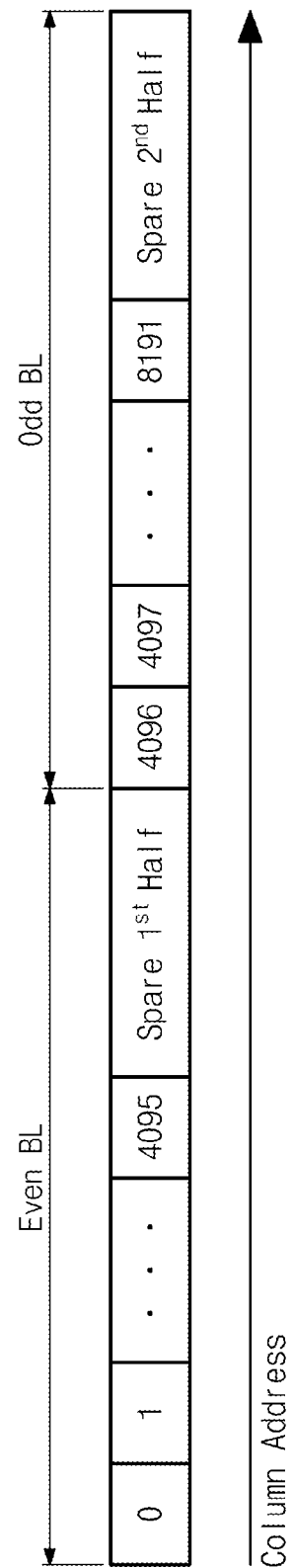
FIG. 3 is a diagram for describing an addressing method for bit lines according to an embodiment of the inventive concept.

FIG. 3 is a diagram for describing an addressing method for bit lines according to an embodiment of the inventive concept. In particular, FIG. 3 illustrates a column addressing manner of an all bit line structure in which an 8 KB-sized page is programmed concurrently.

Even-numbered bit lines BL0, BL2, BL4, . . . , BL8186, BL8188, and BL8190 are addressed by column addresses 0, 1, 2, . . . , 4093, 4094, and 4095, respectively. Odd-numbered bit lines BL1, BL3, BL5, . . . , BL8187, BL8189, and BL8191 are addressed by column addresses 4096, 4097, 4098, . . . , 8189, 8190, and 8191, respectively. In a partial page read mode where the even-numbered bit lines are selected, data sensed via the even-numbered bit lines may constitute a plurality of sectors being continuous. The data sensed via the even-numbered bit lines may be output regardless of whether sensing is made via odd-numbered bit lines.

Although an example is described in which a particular addressing manner is applied to bit lines of a main area which can be selected by an external device via addressing, the inventive concept is not limited to this example. As an alternative, for instance, at reading, bit lines of a spare area may be controlled in the same manner as those of the main area. The partial page read mode may be applied to the bit lines of the spare area, and unselected bit lines may be grounded. That is, bit lines of the spare area comprises the first spare bit lines Spare $1^{st}$ Half corresponding to even-numbered bit lines, and the second spare bit lines Spare $2^{nd}$ Half corresponding to odd-numbered bit lines.

The spare area may be used to store control information (e.g., metadata, a flag bit, etc.) associated with data of the main area. In some embodiments, data sensed via the first spare bit lines Spare $1^{st}$ Half may be configured to provide sufficient control information associated with main data sensed via the even-numbered bit lines BL0, BL2, BL4, . . . , BL8186, BL8188, and BL8190. Data sensed via the second spare bit lines Spare $2^{nd}$ Half may be configured to provide sufficient control information associated with main data sensed via the odd-numbered bit lines BL1, BL3, BL5, . . . , BL8187, BL8189, and BL8191.

In a program operation, control information associated with main data corresponding to the even-numbered bit lines may be stored in the spare area corresponding to the first spare bit lines Spare $1^{st}$ Half. Control information associated with main data corresponding to the odd-numbered bit lines may be stored in the spare area corresponding to the second spare bit lines Spare $2^{nd}$ Half.

Figure 4A:
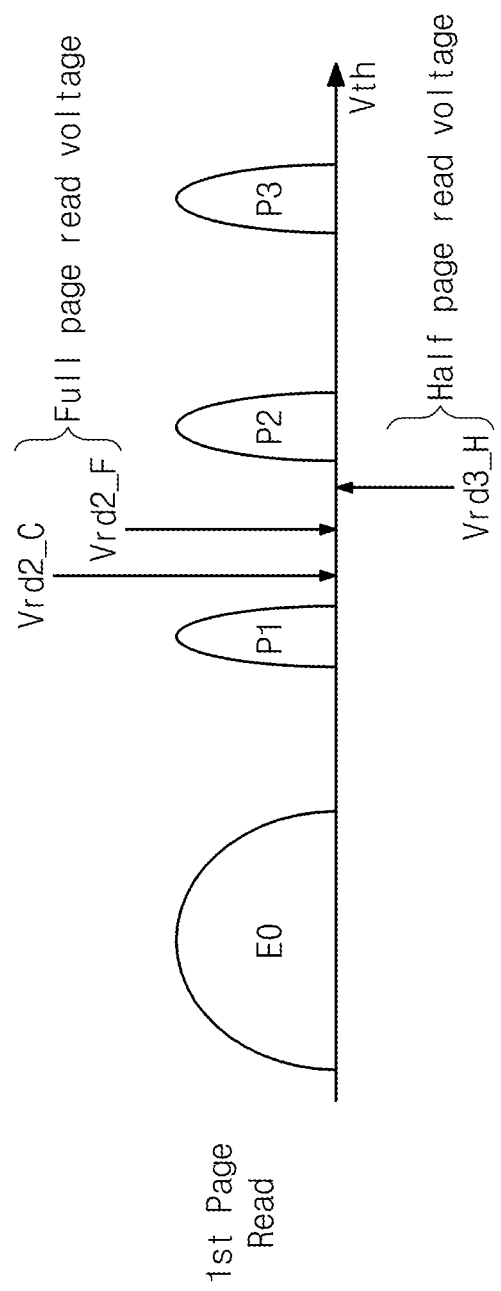
FIGS. 4A and 4B are diagrams for describing a read voltage according to an embodiment of the inventive concept.
Figure 4B:
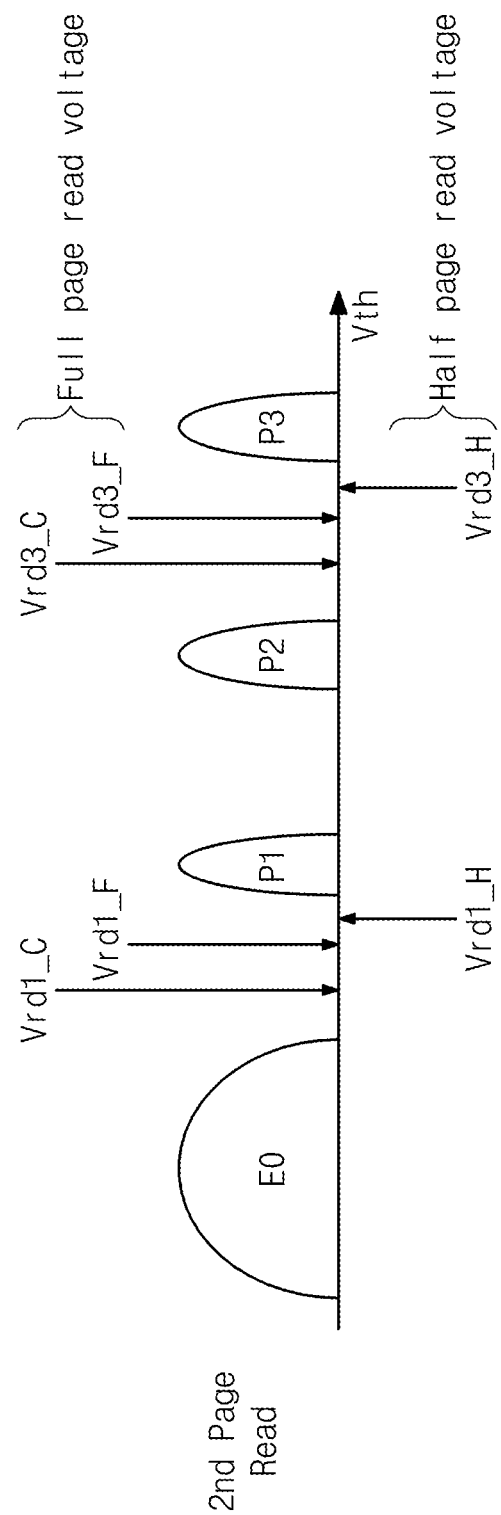

FIGS. 4A and 4B are diagrams for describing a read voltage according to an embodiment of the inventive concept.

Referring to FIGS. 4A and 4B, in a full page read mode, voltage generator 160 generates read voltages Vrd1_C, Vrd1_F, Vrd2_C, Vrd2_F, Vrd3_C, and Vrd3_F for coarse-fine sensing. In a half page read mode, voltage generator 160 generates read voltages Vrd1_H, Vrd2_H, and Vrd3_H. A read operation will be described in the context of a 2-bit multi-level cell.

FIG. 4A shows read voltages provided in a first page (or, MSB page) read operation. Read voltages Vrd2_C and Vrd2_F are provided at coarse-fine sensing for reading a first page. However, in a half page read mode, a read voltage Vrd2_H is provided to read the first page. Read voltage Vrd2_H provided in the half page read mode is higher than read voltages Vrd2_C and Vrd2_F provided in the full page read mode.

FIG. 4B shows read voltages provided in a second page read operation. Read voltages Vrd1_C, Vrd1_F, Vrd3_C, and Vrd3_F are provided at coarse-fine sensing for reading a second page in the full page read mode. In the half page read mode, read voltages Vrd1_H and Vrd3_H are provided to read the second page. Read voltage Vrd1_H provided in the half page read mode is higher than read voltages Vrd1_C and Vrd1_F provided in the full page read mode. Read voltage Vrd3_H provided in the half page read mode is higher than read voltages Vrd3_C and Vrd3_F provided in the full page read mode.

In the full page read mode and the half page read mode, a threshold voltage level is measured differently due to a CSL noise difference. For example, in the half page read mode, a threshold voltage of a program state may be measured highly due to the CSL noise. However, this phenomenon may be compensated by the read voltages Vrd1_H, Vrd2_H, and Vrd3_H set in the half page read mode of the inventive concept. As a result, an error rate similar or equal to that in the full page read mode may be provided by supplying the read voltages Vrd1_H, Vrd2_H, and Vrd3_H in the half page read mode.

Figure 5:
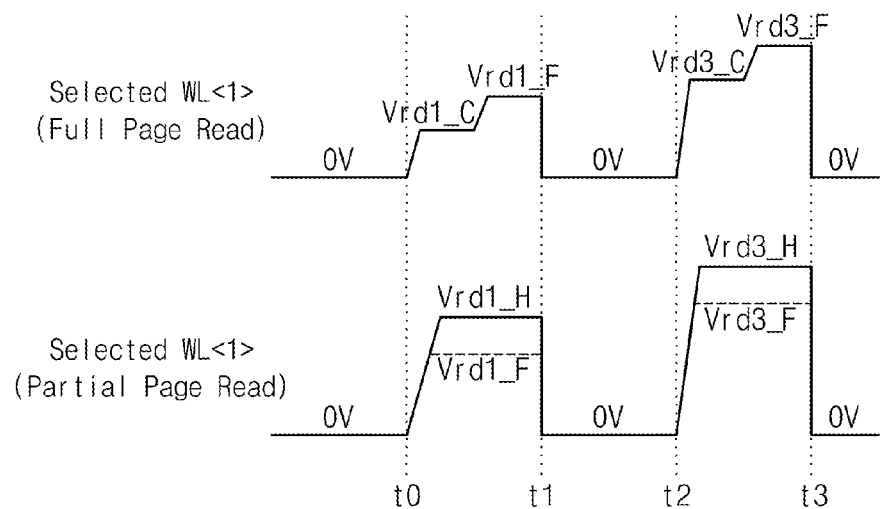
FIG. 5 is a waveform diagram illustrating word line voltages in a read mode according to an embodiment of the inventive concept.

FIG. 5 is a waveform diagram illustrating word line voltages in a read mode according to an embodiment of the inventive concept. Referring to FIG. 5, a waveform of a word line voltage provided to read a second page (or, LSB page) in a full page read mode may be different from that in a partial page read mode.

In the full page read mode, a read voltage for coarse-fine sensing may be applied to a selected word line. During a time period t0 to t1, a sensing operation may be made to discriminate an erase state E0 and a program state P1. Read voltages Vrd1_C and Vrd1_F for coarse sensing and fine sensing are sequentially applied to a selected word line (e.g., WL<1>). During a time period t1 to t2, the selected word line may be discharged. During a time period t2 to t3, a sensing operation may be performed to discriminate a program state P2 and a program state P3. Read voltages Vrd3_C and Vrd3_F for coarse sensing and fine sensing may be sequentially applied to the selected word line.

In the partial page read mode, a read voltage for fine sensing may be applied to a selected word line. During a time period t0 to t1, a sensing operation may be made to discriminate an erase state E0 and a program state P1. A read voltage Vrd1_H for fine sensing may be applied to a selected word line (e.g., WL<1>). During a time period t1 to t2, the selected word line may be discharged. During a time period t2 to t3, a sensing operation may be performed to discriminate a program state P2 and a program state P3. A read voltage Vrd3_H for fine sensing may be applied to the selected word line. Read voltage Vrd1_H provided in the partial page read mode may be higher than a read voltage Vrd1_F provided in the full page read mode. Read voltage Vrd3_H provided in the partial page read mode is higher than a read voltage Vrd3_F provided in the full page read mode.

Although FIG. 5 shows a waveform in a second page read operation, the inventive can be applied in a first page read operation as well. For example, in the first page read operation, a read voltage Vrd2_H provided in the partial page read mode is higher than a read voltage Vrd2_F provided in the full page read mode. In the partial page read mode, a waveform or a pulse width can be modified or changed variously.

Figure 6:
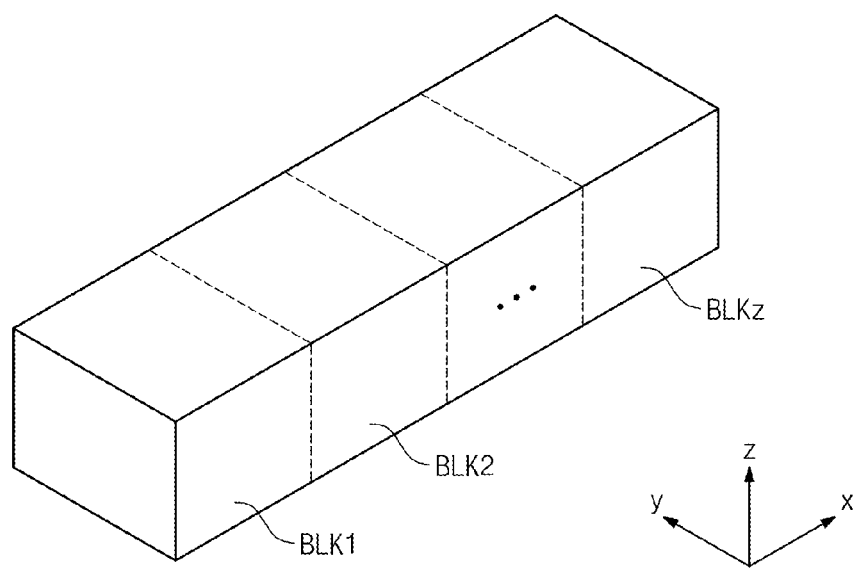
FIG. 6 is a diagram illustrating a memory cell array in FIG. 1 according to an embodiment of the inventive concept.

FIG. 6 is a diagram illustrating memory cell array 110 of FIG. 1 according to an embodiment of the inventive concept.

Referring to FIG. 6, memory cell array 110 comprises a plurality of memory blocks BLK1 to BLKz, each of which is formed to have a three-dimensional structure (or, a vertical structure). For example, each of the memory blocks BLK1 to BLKz comprises structures extending along the first to third directions x, y, and z. Each of the memory blocks BLK1 to BLKz comprises a plurality of NAND cell strings extending along the third direction z.

Each NAND cell string is coupled with a bit line BL, a string selection line SSL, a plurality of word lines WL, a ground selection line GSL, and a common source line CSL. That is, each memory block is coupled with a plurality of bit lines, a plurality of string selection lines, a plurality of word lines, a plurality of ground selection lines, and a common source line CSL. Memory blocks will be more fully described with reference to FIG. 7.

Figure 7:
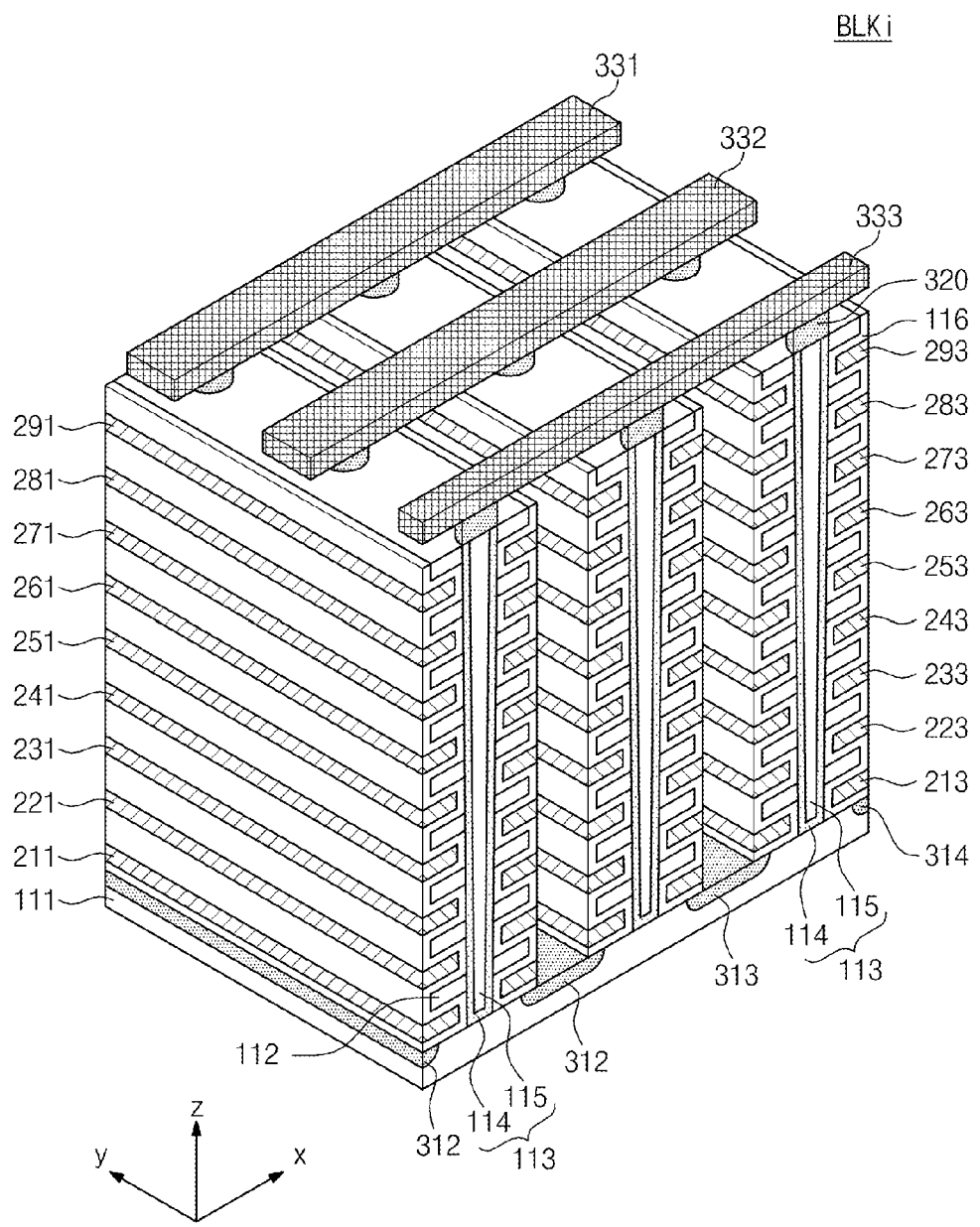
FIG. 7 is a perspective view of a memory block in FIG. 6 according to an embodiment of the inventive concept.

FIG. 7 is a perspective view of one of the memory blocks in FIG. 6 according to an embodiment of the inventive concept.

Referring to FIGS. 7, a memory block BLKi comprises structures that are extended in the first to third directions x, y, and z. Memory block BLKi comprises a substrate 111 formed of a silicon material to which the first type impurity is injected. For example, substrate 111 may be formed of a p-well where Group IV element such as boron is injected. As an example, substrate 111 may be a pocket p well provided within an n-well. Hereinafter, it is assumed that substrate 111 is a p-well. However, substrate 111 is not limited thereto.

A plurality of doping regions 311 to 314 extended in the first direction x are formed on substrate 111. For example, doping regions 311 to 314 may have an n-type, respectively. Hereinafter, it is assumed that the first to fourth doping regions 311 to 314 are an n-type. However, the first to fourth doping regions 311 to 314 are not limited thereto.

In a region on substrate 111 between the first and second doping regions 311 and 312, a plurality of insulating materials 112 extending along the first direction may be sequentially provided along the third direction. For example, the plurality of insulating materials 112 may be formed to be spaced apart along the third direction z. Insulating materials 112 may comprise, for example, silicon oxide.

On substrate 111 between the first and second doping regions 311 and 312, a plurality of pillars 113 are provided which are sequentially disposed along the second direction and pass through insulating materials 112 along the third direction. Pillars 113 are typically connected to substrate 111 through insulating materials 112, respectively. Herein, pillars 113 may be formed on substrate 111 between the second and third doping regions 312 and 313 and between third and fourth doping regions 313 and 314, respectively.

Each of pillars 113 can be formed of a plurality of materials. For example, surface layer 114 of each pillar 113 can comprise a silicon material having the first type. As a more specific example, in some embodiments surface layer 114 of each pillar 113 comprises a silicon material which is doped by the same type of substrate 111. Hereinafter, it is assumed that surface layer 114 of each pillar 113 comprises p-type silicon. However, surface layer 114 of each pillar 113 is not limited thereto.

Inner layer 115 of each pillar 113 may be formed of an insulating material. For example, inner layer 115 of each pillar 113 may be filled by an insulating material such as silicon oxide. For example, inner layer 115 of each pillar 113 comprises an air gap.

In a region between the first and second doping regions 311 and 312, an insulation layer 116 may be provided along the exposed surfaces of substrate 111, insulating materials 112, and pillars 113. As an example, an insulation layer 116 can be removed from an exposed surface toward the third direction z of last insulation material 112.

In some embodiments, the thickness of insulation layer 116 may be less than half a distance between insulating materials 112. That is, a region where a material other than insulating materials 112 and insulation layer 116 may be disposed, may be provided between an insulation layer 116 provided on a lower surface of the first insulating material among insulating materials 112 and an insulation layer 116 provided on an upper surface of the second insulating material and at the lower portion of the first insulating material.

In the region between the first and second doping regions 311 and 312, first conductive materials 211 to 291 may be provided onto an exposed surface of insulation layer 116. For example, conductive material 211 extending along the second direction y may be provided between substrate 111 and insulating material 112 adjacent to substrate 111. More specifically, conductive material 211 extending along the first direction x may be provided between substrate 111 and insulation layer 116 of the lower surface of insulating material 112 adjacent to substrate 111.

The first conductive material extending along the first direction may be provided between insulation layer 116 of an upper surface of a specific insulating material among insulating materials 112 and insulation layer 116 of a lower surface of an insulating material disposed at the upper portion of the specific insulating material. As an example, first conductive materials 221 to 281 extending along the first direction may be provided between insulating materials 112. First conductive materials 211 to 291 may be metal materials or other conductive materials such as polysilicon.

The same structure as first and second doping regions 311 and 312 may be provided between second and third doping regions 312 and 313. Between second and third doping regions 312 and 313, for example, there may be insulating materials 112 extending along the first direction, pillars 113 sequentially disposed along the first direction and passing through insulating materials 112 along the third direction, insulation layer 116 on insulating materials 112 and exposed surfaces of pillars 113, and first conductive materials 212 to 292 extending along the first direction.

The same structure that on first and second doping regions 311 and 312 may be provided between third and fourth doping regions 313 and 314. Between third and fourth doping regions 313 and 314, for example, there may be insulating materials 112 extending along the first direction, pillars 113 sequentially disposed along the first direction and passing through insulating materials 112 along the third direction, insulation layer 116 on insulating materials 112 and the exposed surfaces of pillars 113, and conductive materials 213 to 293 extending along the first direction.

Drains 320 may be provided onto pillars 113, respectively. Drains 320 may comprise, for instance, silicon materials doped in a second type, such as n-type silicon materials. Hereinafter, it is assumed that drains 320 comprise n-type silicon. However, drains 320 are not limited thereto. The width of each of drains 320 may be greater than that of a corresponding pillar 113. For example, each drain 320 may be provided in a pad shape on the upper surface of a corresponding pillar 113.

Second conductive materials 331 to 333 extending along the third direction may be provided on drains 320. Second conductive materials 331 to 333 may be sequentially disposed along the first direction. Second conductive materials 331 to 333 are connected to drains 320 of corresponding regions, respectively. Drains 320 and the conductive material extending along the third direction may be connected through contact plugs. Second conductive materials 331 to 333 extending along the third direction may be metal materials. Second conductive materials 331 to 333 may be conductive materials such as polysilicon.

Figure 8:
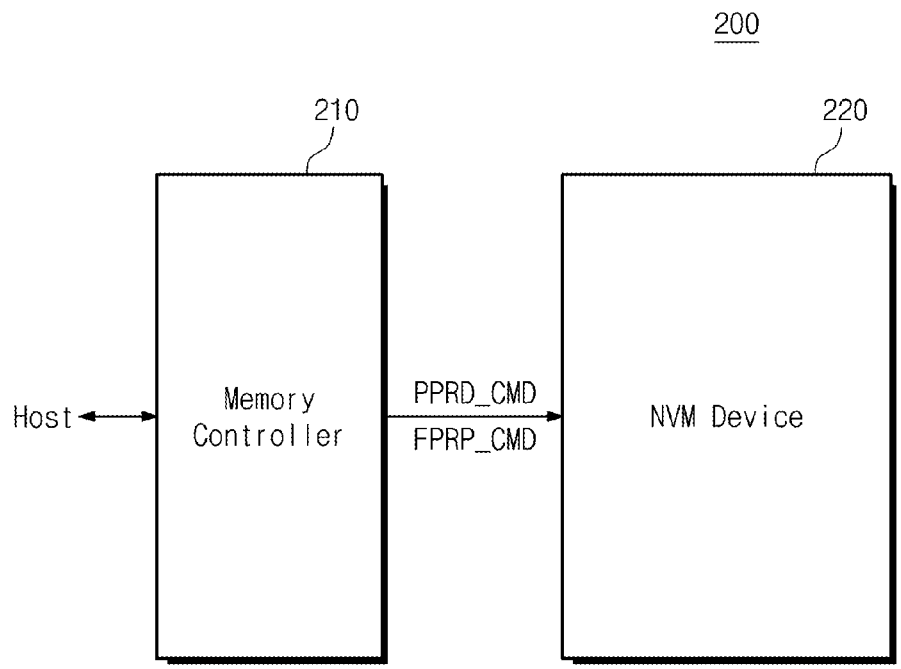
FIG. 8 is a block diagram illustrating a memory system according to an embodiment of the inventive concept.

FIG. 8 is a block diagram illustrating a memory system 200 according to an embodiment of the inventive concept.

Referring to FIG. 8, memory system 200 comprises a memory controller 210 and a nonvolatile memory device 220. Memory controller 210 selects a read mode of nonvolatile memory device 220 using a command.

Memory controller 210 controls nonvolatile memory device 220, for example, by providing it with a read command corresponding to a full page read mode or a partial page read mode. Where a selected page is accessed according to the full page read mode, memory controller 210 provides a full page read command FPRD_CMD to nonvolatile memory device 220. Where a selected page is accessed according to the partial page read mode, memory controller 210 may provide a partial page read command PPRD_CMD to nonvolatile memory device 220.

Nonvolatile memory device 220 accesses memory cells based upon a read command FPRD_CMD or PPRD_CMD from memory controller 210. Where a read command provided from memory controller 210 corresponds to the full page read mode, nonvolatile memory device 220 senses all memory cells in a selected page. At this time, memory cells in the selected page may be read in a coarse-fine sensing manner. Where a read command provided from memory controller 210 corresponds to the partial page read mode, nonvolatile memory device 220 may sense some of memory cells in the selected page. At this time, the selected memory cells may be sensed using a voltage level different from a read voltage provided in a coarse-fine sensing mode. That is, a read voltage provided in the partial page read mode may be higher in level than that provided in the full page read mode to sense the same data state.

Figure 9:
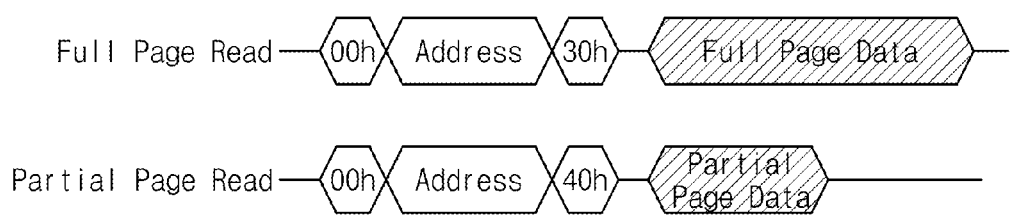
FIG. 9 is a timing diagram illustrating a read operation performed in response to a read command illustrated in FIG. 8 according to an embodiment of the inventive concept.

FIG. 9 is a timing diagram illustrating a read operation performed in response to the read command of FIG. 8. A command input sequence in a full page read mode and a command input sequence in a partial page read mode are illustrated in FIG. 9, respectively.

In the full page read mode, memory controller 210 provides nonvolatile memory device 220 with a typical page read command. For example, memory controller 210 may provide nonvolatile memory device 220 with a command/address sequence 00h-Address-30h. Nonvolatile memory device 220 selects a page corresponding to the address and may perform sensing on the selected page in a coarse-fine sensing manner. Nonvolatile memory device 220 latches sensed full page data and outputs it as full page data after a predetermined time.

In the partial page read mode, memory controller 210 provides nonvolatile memory device 220 with partial page read command PPRD_CMD. For example, memory controller 210 may provide nonvolatile memory device 220 with a command/address sequence 00h-Address-40h. Nonvolatile memory device 220 selects a page corresponding to the address and performs a partial page read operation. Upon sensing of the same data state, a read voltage provided in the partial page read mode may be higher than a read voltage provided in the full page read mode. Nonvolatile memory device 220 may latch sensed partial page data and may output it as partial page data after a predetermined time.

In the partial page read mode, sensed partial page data can be output to an external device immediately when it is latched. Accordingly, sensing-completed partial page data may be output before sensing on a whole page is completed. This means that output timing of partial page data is nearly identical to that of full page data or is faster than that of the full page data. This is because a data state is once sensed using a read voltage in the partial page read mode. That is, an output point of time of partial page data may become faster by reducing a sensing time.

Figure 10:
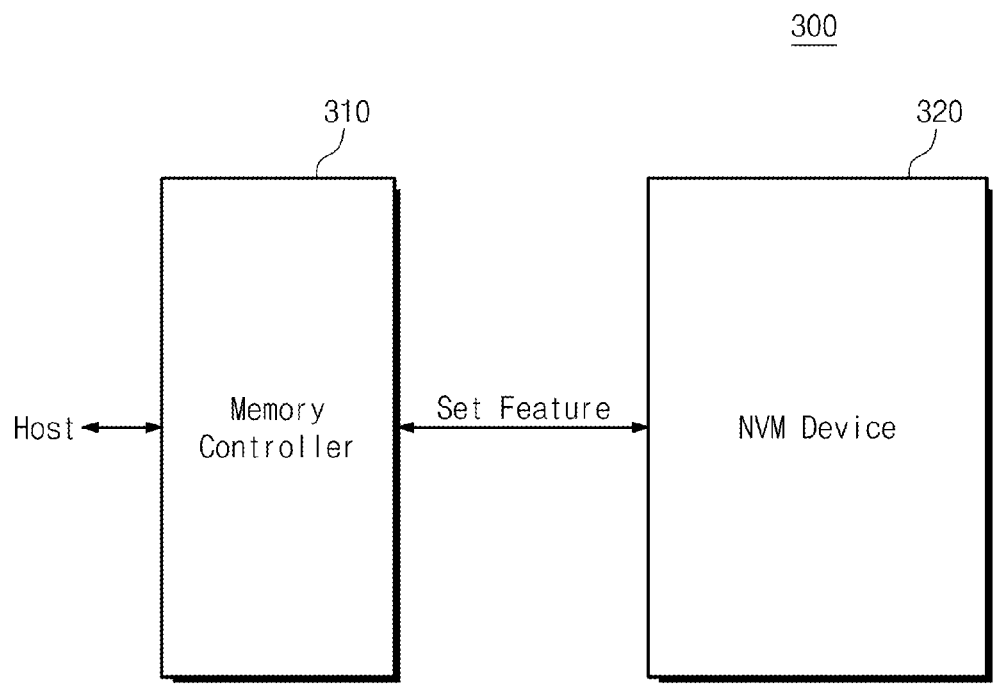
FIG. 10 is a block diagram illustrating a memory system according to another embodiment of the inventive concept.

FIG. 10 is a block diagram illustrating a memory system 300 according to another embodiment of the inventive concept.

Referring to FIG. 10, memory system 300 comprises a memory controller 310 and a nonvolatile memory device 320. Memory controller 310 sets up a read mode of nonvolatile memory device 320 using a set feature command.

Memory controller 310 establishes a set feature of nonvolatile memory device 320. Where a read request corresponds to a full page read mode, memory controller 310 may provide nonvolatile memory device 320 with a typical page read command. If the read request corresponds to a partial page read mode, memory controller 310 provides nonvolatile memory device 320 with a set feature command so as to switch into a set feature corresponding to the partial page read mode. If setup of the set feature is completed, memory controller 310 may provide nonvolatile memory device 320 with a read command and an address.

Nonvolatile memory device 320 sets overall parameters for executing a read mode based upon the set feature command from memory controller 310. In a default state, that is, before the set feature command is provided, a read mode of nonvolatile memory device 320 may have a set feature corresponding to the full page read mode. If the set feature command is provided, parameters of nonvolatile memory device 320 may be adjusted to execute the partial page read mode. Nonvolatile memory device 320 may be again set up to the default state by a command for recovering a set feature to a condition for the full page read mode.

Figure 11:
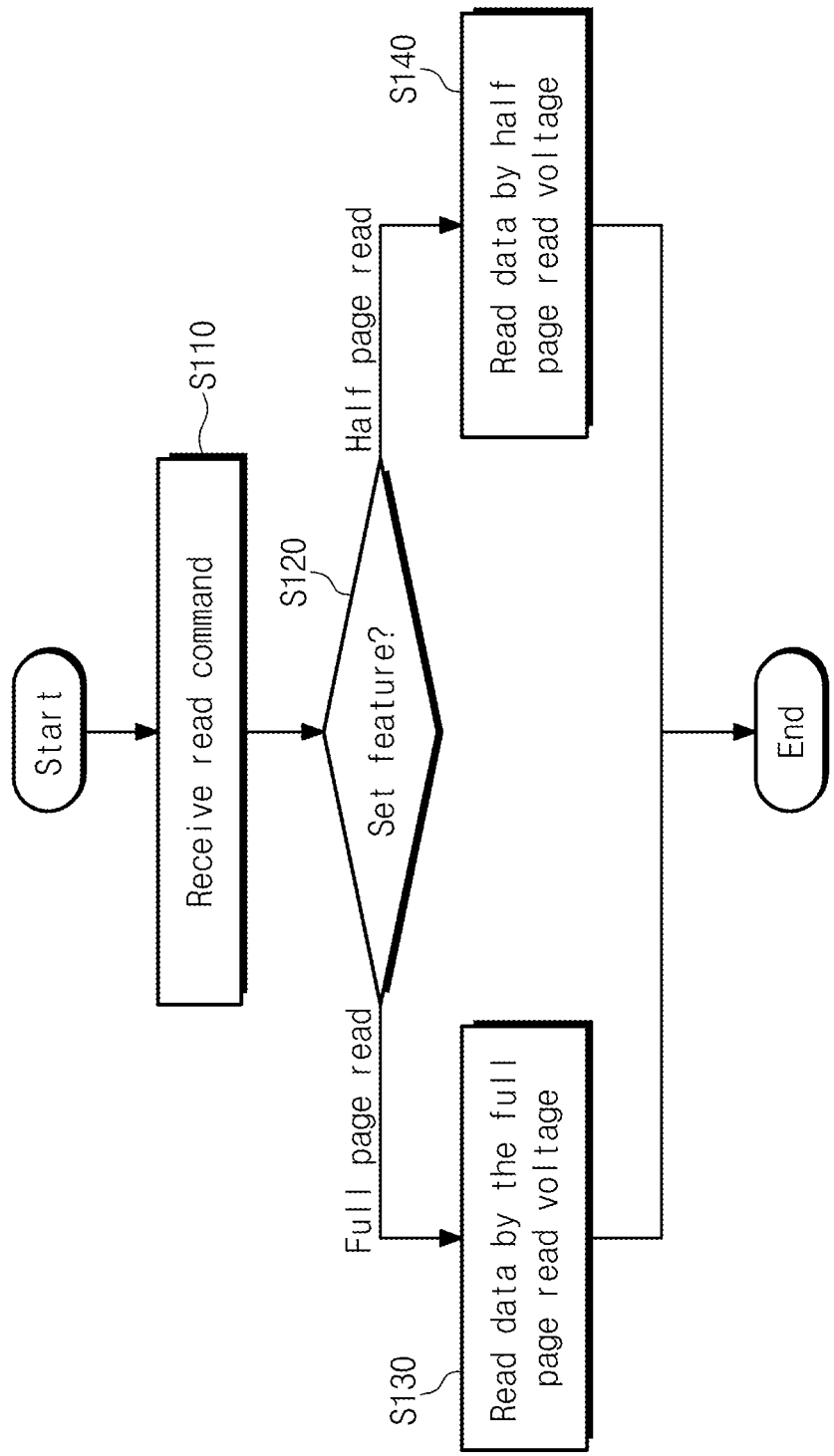
FIG. 11 is a flowchart for describing an operation of the memory system of FIG. 10 according to an embodiment of the inventive concept.

FIG. 11 is a flowchart for describing an operation of memory system 300 of FIG. 10 according to an embodiment of the inventive concept.

Referring to FIG. 11, nonvolatile memory device 320 executes a read command from memory controller 310 based upon a set feature value being internally configured. Herein, it is assumed that a read mode of nonvolatile memory device 320 is previously set up by a set feature command.

In operation S110, nonvolatile memory device 320 receives a read command from memory controller 310. In operation S120, nonvolatile memory device 320 checks a previously established read mode to execute the input read command. For example, nonvolatile memory device 320 may judge whether the previously established set feature corresponds to a full page read mode or a partial page read mode. If the previously established set feature corresponds to the full page read mode, the method proceeds to operation S130. If the previously established set feature corresponds to the partial page read mode, the method proceeds to operation S140.

In operation S130, nonvolatile memory device 320 senses and outputs memory cells corresponding to an input address according to the full page read mode. In the full page read mode, nonvolatile memory device 320 senses the selected memory cells in a coarse-fine sensing manner. In the full page read mode, read voltages for coarse-fine sensing (e.g., Vrd1_C, Vrd1_F, Vrd2_C, Vrd2_F, Vrd3_C, and Vrd3_F) may be provided. After the sensed data is output, reading of the requested data ends.

In operation S140, nonvolatile memory device 320 senses memory cells corresponding to an input address according to the partial page read mode. When the selected memory cells are sensed according to the partial page read mode, read voltages (e.g., Vrd1_H, Vrd2_H, Vrd3_H) may be provide which are higher than that provided in the full page read mode.

As indicted by the above description of the read operation of nonvolatile memory device 320, a selected page of data may be sensed according to the full page read mode or the partial page read mode.

Figure 12:
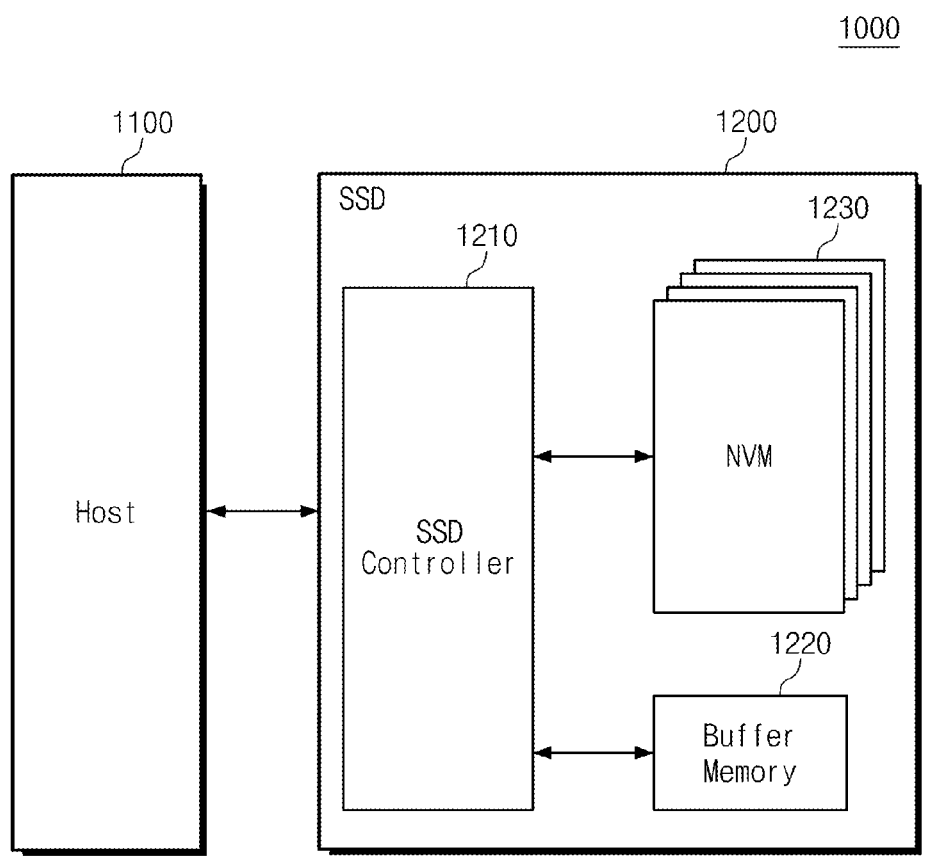
FIG. 12 is a block diagram illustrating a system comprising a solid state drive according to an embodiment of the inventive concept.

FIG. 12 is a block diagram illustrating a system 1000 comprising a solid state drive according to an embodiment of the inventive concept.

Referring to FIG. 12, system 1000 comprises a host 1100 and an SSD 1200. SSD 1200 comprises an SSD controller 1210, a buffer memory 1220, and a nonvolatile memory device 1230.

SSD controller 1210 provides physical interconnection between host 1100 and SSD 1200. SSD controller 1210 provides an interface with SSD 1200 corresponding to a bus format of host 1100. In particular, SSD controller 1210 decodes a command provided from host 1100. SSD controller 1210 accesses nonvolatile memory device 1230 according to a result of the decoding. The bus format of host 1100 may comprise, for instance, USB, SCSI, PCI-E, ATA, PATA, SATA, or SAS.

SSD controller 1210 decodes a read request from host 1100 to select one of a partial page read mode and a full page read mode. SSD controller 1210 controls nonvolatile memory device 1230 to access memory cells according to a corresponding read mode. For example, SSD controller 1210 may control nonvolatile memory device 1230 using a specific read command (e.g., a partial page read command) or to set up a set feature.

Buffer memory 1220 temporarily stores write data provided from host 1100 or data read out from nonvolatile memory device 1230. In the event that data in nonvolatile memory device 1230 is cached in a read request of host 1100, buffer memory 1220 may support a cache function of providing cached data directly to host 1100. Typically, a data transfer speed of a bus format (e.g., SATA or SAS) of host 1100 may be higher than that of a memory channel of SSD 1200. That is, in the event that an interface speed of host 1100 is remarkably fast, lowering of the performance due to a speed difference may be minimized by providing buffer memory 1220 having a large storage capacity.

Buffer memory 1220 may be formed of a synchronous DRAM to provide sufficient buffering to SSD 1200 used as an auxiliary mass storage device. However, buffer memory 1220 is not limited to this example.

Nonvolatile memory device 1230 may be provided as a storage medium of SSD 1200. For example, nonvolatile memory device 1230 may be formed of a NAND flash memory device having a mass storage capacity. Nonvolatile memory device 1230 may be configured such that a read voltage in a fine sensing mode on the same data state is higher than that in a partial page read mode. In this case, it is possible to secure high reliability of data even in a partial page read mode. Nonvolatile memory device 1230 may be formed of a plurality of memory devices. In this case, memory devices may be connected with SSD controller 1210 by a channel unit. Nonvolatile memory device 1230 is not limited to a NAND flash memory device. For example, a PRAM, an MRAM, a ReRAM, a FRAM, a NOR flash memory, etc. may be used as a storage medium of SSD 1200. Further, the inventive concept may be applied to a memory system which uses different types of memory devices together. Nonvolatile memory device 1230 may be configured substantially the same as nonvolatile memory device 100 of FIG. 1.

Figure 13:
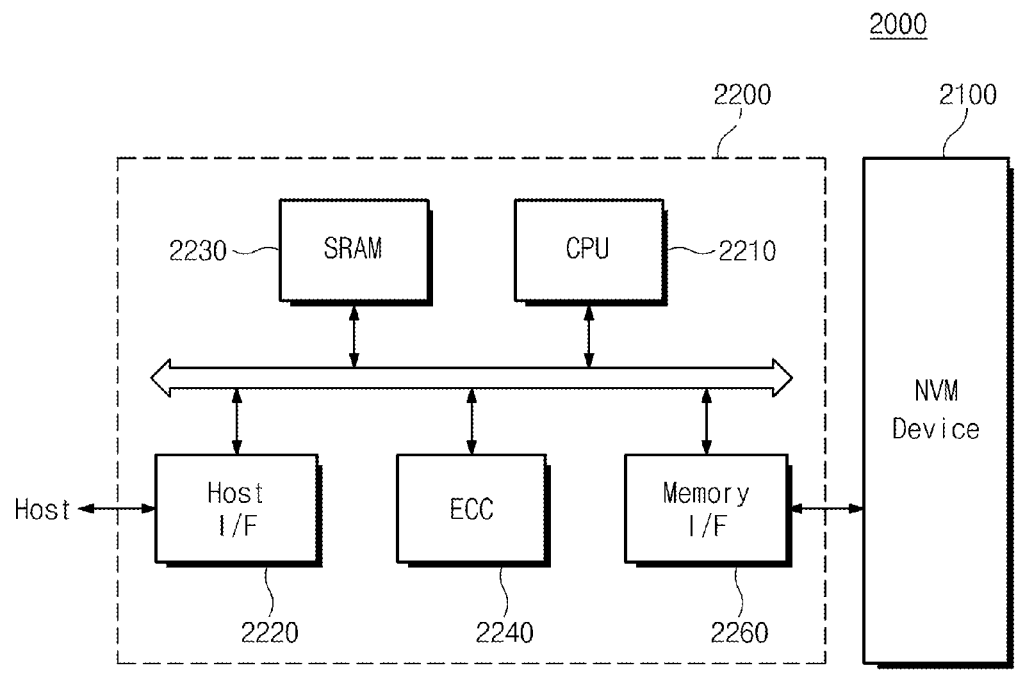
FIG. 13 is a block diagram illustrating a memory system according to another embodiment of the inventive concept.

FIG. 13 is a block diagram illustrating a memory system 2000 according to another embodiment of the inventive concept.

Referring to FIG. 13, memory system 2000 comprises a nonvolatile memory device 2100 and a memory controller 2200. Nonvolatile memory device 2100 may be configured such that a read voltage in a fine sensing mode on the same data state is higher than that in a partial page read mode. In this case, it is possible to secure high reliability of data even in a partial page read mode.

Memory controller 2200 is configured to control nonvolatile memory device 2100. An SRAM 2230 may be used as a working memory of a CPU 2210. A host interface 2220 comprises a data exchange protocol of a host connected with memory system 2000. An ECC block 2240 may be configured to detect and correct errors in data read out from nonvolatile memory device 2100. A memory interface 2260 interfaces with nonvolatile memory device 2100. CPU 2210 may execute an overall control operation for data exchange of memory controller 2200. Although not shown in FIG. 13, memory system 2000 may further include ROM to store code data for interfacing with the host.

Memory controller 2200 may communicate with an external device (e.g., host) using one of various standard interface protocols such as USB, MMC, PCI-E, SAS, SATA, PATA, SCSI, ESDI, or IDE, for example.

Memory controller 2200 decodes a read request from a host to select one of a partial page read mode and a full page read mode. Memory controller 2200 controls nonvolatile memory device 2100 to access memory cells according to a corresponding read mode. For example, memory controller 2200 may control nonvolatile memory device 2100 using a specific read command (e.g., a partial page read command) or to set up a set feature.

In some embodiments, memory system 2000 is used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information in a wireless circumstance, one of various electronic devices constituting home network, one of various electronic devices constituting computer network, one of various electronic devices constituting telematics network, RFID, or one of various electronic devices constituting a computing system.

Figure 14:
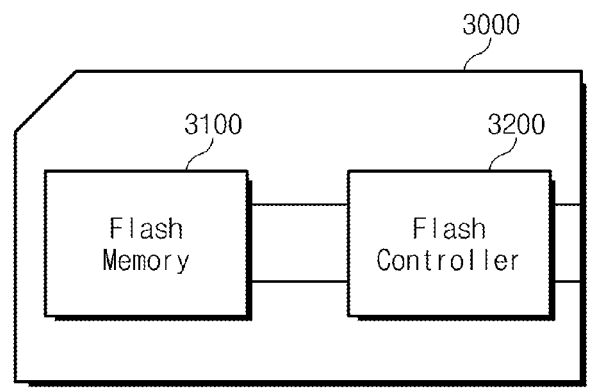
FIG. 14 is a block diagram illustrating a data storage device according to still another embodiment of the inventive concept.

FIG. 14 is a block diagram illustrating a data storage device 3000 according to still another embodiment of the inventive concept.

Referring to FIG. 14, data storage device 3000 comprises a flash memory 3100 and a flash controller 3200. Flash controller 3200 controls flash memory 3100 in response to control signals input from the outside of data storage device 3000.

Flash memory 3100 may be configured substantially same as nonvolatile memory device 100 of FIG. 1. Moreover, flash memory 3100 may be configured to have any one of a stack flash structure comprising arrays stacked at multiple layers, a source-drain free flash structure, a pin-type flash structure, and a three-dimensional (or, vertical) flash structure. Flash memory 3100 may be configured such that a read voltage in a fine sensing mode on the same data state is higher than that in a partial page read mode. In this case, it is possible to secure high reliability of data even in a partial page read mode.

Flash controller 3200 decodes a read request from a host to select one of a partial page read mode and a full page read mode. Flash controller 3200 controls flash memory 3100 to access memory cells according to a corresponding read mode. For example, flash controller 3200 may control flash memory 3100 using a specific read command (e.g., a partial page read command) or to set up a set feature.

Data storage device 3000 may be, for example, a memory card device, an SSD device, a multimedia card device, an SD card, a memory stick device, a HDD device, a hybrid drive device, or an USB flash device. For example, data storage device 3000 may be a card which satisfies a standard for using a device such as a digital camera, or a personal computer.

Figure 15:
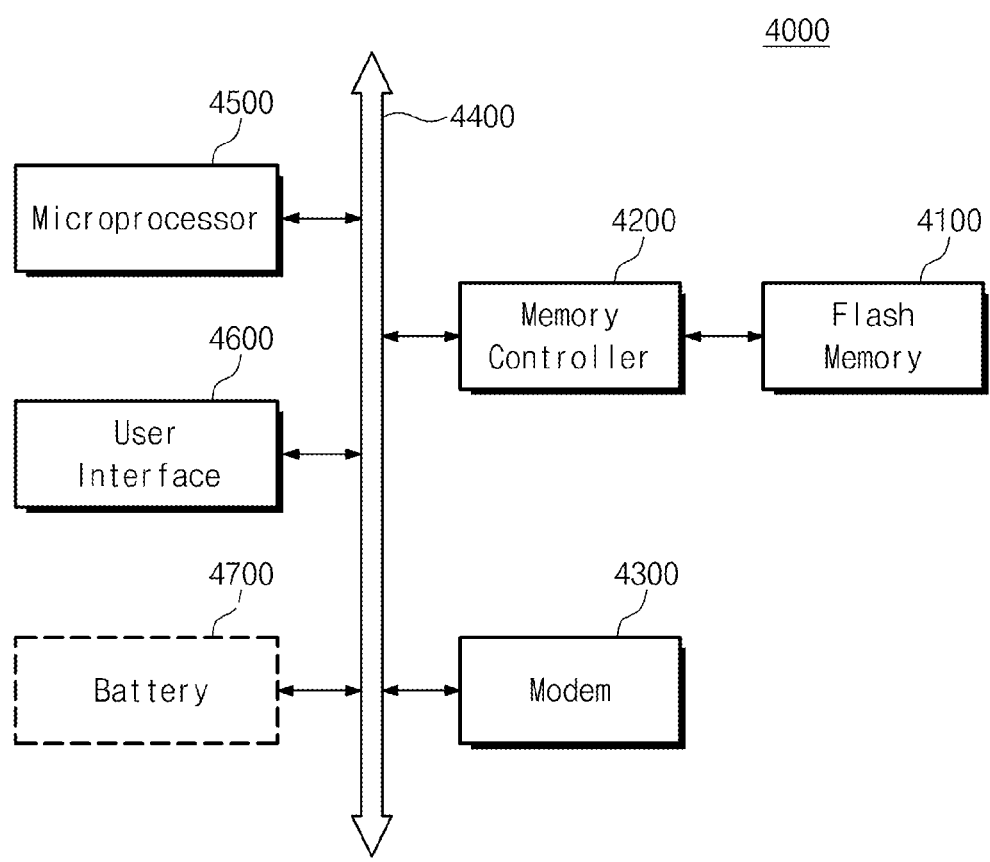
FIG. 15 is a block diagram illustrating a computing system comprising a memory system according to an embodiment of the inventive concept.

FIG. 15 is a block diagram illustrating a computing system 4000 comprising a memory system according to an embodiment of the inventive concept.

Referring to FIG. 15, computing system 4000 comprises a flash memory device 4100, a memory controller 4200, a modem 4300 such as a baseband chipset, a microprocessor 4500, and a user interface 4600.

Flash memory device 4100 in FIG. 15 may be configured substantially the same as nonvolatile memory device 100 illustrated in FIG.1. Flash memory device 4100 may be configured to have any one of a stack flash structure comprising arrays stacked at multiple layers, a source-drain free flash structure, a pin-type flash structure, and a three-dimensional (or, vertical) flash structure.

Flash memory device 4100 comprises a cell array having an all bit line structure. Flash memory device 4100 executes a partial page read mode additionally. In the partial page read mode, flash memory device 4100 grounds unselected bit lines and may make fine sensing on selected bit lines. Flash memory device 4100 may be configured such that a read voltage in a fine sensing mode on the same data state is higher than that in a partial page read mode. In this case, it is possible to secure high reliability of data even in a partial page read mode.

If computing system 4000 is a mobile device, it may further include a battery 4700 which powers computing system 4000. Although not shown in FIG. 19, computing system 4000 may further comprise an application chipset, a camera image processor (CIS), a mobile DRAM, and the like. Memory controller 4200 and flash memory device 4100 may constitute a solid state drive/disk (SSD) which uses a nonvolatile memory to store data.

A nonvolatile memory device or a memory controller as described above may be packed in any of various types of packages or package configurations such as package on package, ball grid arrays, chip scale packages, plastic leaded chip carrier, plastic dual in-line package, die in waffle pack, die in wafer form, chip on board, ceramic dual in-line package, plastic metric quad flat pack, thin quad flatpack, small outline, shrink small outline package, thin small outline, system in package, multi chip package, and wafer-level fabricated package, wafer-level processed stack package.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device, comprising:
a cell array connected to a plurality of bit lines and a plurality of word lines;
a page buffer circuit configured to sense memory cells connected to a selected word line via the plurality of bit lines;
a voltage generator configured to provide a read voltage to the selected word line; and
control logic configured to control the page buffer circuit and the voltage generator to sense the memory cells connected to the selected word line according to a first read mode or a second read mode,
wherein the number of memory cells to be sensed in the first read mode is different from the number of memory cells to be sensed in the second read mode, and a read voltage on the same data state varies according to the number of memory cells to be sensed.

2. The nonvolatile memory device of claim 1, wherein in the first read mode, the voltage generator provides the selected word line with a first read voltage and a second read voltage higher than the first read voltage to identify a data state.

3. The nonvolatile memory device of claim 2, wherein, where the second read voltage is provided, the page buffer circuit selects and senses a memory cell determined to be an off-cell by the first read voltage.

4. The nonvolatile memory device of claim 2, wherein in the second read mode, the voltage generator generates a read voltage higher than the second read voltage to identify the data state.

5. The nonvolatile memory device of claim 1, wherein in the second read mode, the page buffer circuit grounds bit lines corresponding to an unselected column of the memory cells connected to the selected word line.

6. The nonvolatile memory device of claim 1, wherein the page buffer circuit senses memory cells corresponding to even and odd columns in the first read mode and memory cells corresponding to ones of even and odd columns in the second read mode.

7. The nonvolatile memory device of claim 1, wherein one of the first read mode and the second read mode is selected by a read command or setting of a set feature.

8. A memory system comprising:
a nonvolatile memory device having an all bit line structure; and
a memory controller configured to transmit to the nonvolatile memory device a command for a read operation of a selected page, wherein the command is a full page read command or a partial page read command,
wherein the nonvolatile memory device is configured to perform the read operation for a predetermined data value with a read voltage that varies according to whether the command is a full page read command or a partial page read command.

9. The memory system of claim 8, wherein the read voltage has a higher level where the command is the partial page read command than where the command is the full page read command.

10. The memory system of claim 8, wherein the nonvolatile memory device performs a sensing operation using different read voltages at least twice to identify one data state, and performs a sensing operation using a read voltage once to identify another data state.

11. A method of operating a nonvolatile memory device, comprising:
receiving a read command from a memory controller;
determining a read mode of the nonvolatile memory device, wherein determining the read mode comprises determining whether the read mode is a half page read mode or a full page read mode;
selecting a read voltage based on the read mode;
performing a read operation on memory cells of a selected page of the nonvolatile memory device using the selected read voltage, wherein the read operation is performed using coarse-fine sensing upon determining that the read mode is the full page read mode.

12. The method of claim 11, wherein the read voltage is selected from among a full page read voltage corresponding to the full page read mode and a half page read voltage corresponding to the half page read mode, wherein the half page read voltage is greater than the full page read voltage.

13. The method of claim 11, further comprising performing the read operation without coarse-fine sensing upon determining that the read mode is the half page read mode.

14. The method of claim 11, wherein the read mode determines a number of memory cells of the selected page to be read by the read operation.

15. The method of claim 11, wherein the nonvolatile memory device is a multi-level cell flash memory device.

16. The method of claim 11, further comprising, in a first read mode, grounding bit lines corresponding to an unselected column of the memory cells connected to the selected word line.

17. The method of claim 11, further comprising sensing memory cells corresponding to even and odd columns in a first read mode and sensing memory cells corresponding to one of even and odd columns in a second read mode.

18. The method of claim 11, wherein the nonvolatile memory device performs a sensing operation using different read voltages at least twice to identify one data state, and performs a sensing operation using a read voltage once to identify another data state.

* * * * *